United States Patent [19]
De

[11] Patent Number: 5,986,476
[45] Date of Patent: Nov. 16, 1999

[54] METHOD AND APPARATUS FOR IMPLEMENTING A DYNAMIC ADIABATIC LOGIC FAMILY

[75] Inventor: Vivek K. De, Hillsboro, Oreg.

[73] Assignee: Intel Corporation, Santa Clara, Calif.

[21] Appl. No.: 08/908,582

[22] Filed: Aug. 8, 1997

[51] Int. Cl.$^6$ ..................................................... H03K 19/96
[52] U.S. Cl. ............................... 326/98; 326/97; 326/121
[58] Field of Search .......................... 326/93, 121, 95–98

[56] References Cited

U.S. PATENT DOCUMENTS

| | | | |
|---|---|---|---|
| 5,378,940 | 1/1995 | Knight, Jr. et al. . | |
| 5,396,527 | 3/1995 | Schlecht et al. . | |
| 5,459,414 | 10/1995 | Dickinson | 326/98 |
| 5,506,519 | 4/1996 | Avery et al. | 326/95 |
| 5,521,538 | 5/1996 | Dickinson | 326/93 |
| 5,568,069 | 10/1996 | Chow . | |
| 5,670,899 | 9/1997 | Kohdaka | 326/97 |
| 5,675,263 | 10/1997 | Gabara | 326/97 |
| 5,701,093 | 12/1997 | Suzuki | 326/98 |

OTHER PUBLICATIONS

Younis, S.C., "Asymptotically Zero Energy Computing Using Split–Level Charge Recovery Logic", Thesis submitted in partial fulfillment for Doctor of Philosophy at MIT, Jun. 1994.

Koller, J.G.: "Adiabatic Switching, Low Energy Computing and the Physics of Computation", Proceedings of Workshop on Physics of Storing and Erasing Information, Oct. 1992, IEEE Press pp. 1–7.

T. Gabara, "Pulsed Power Supply CMOS—PPS—Model", 1994 IEEE Symposium.

V.K. De and J.D. Meindl, "Complementary Adiabatic and Fully Adiabatic MOS Logic Families for Gigascale Integration", ISSCC: Dig. of Tech. Papers, pp. 298–299, Feb. 10, 1996.

J. Lotz et al., "A Quad–Issue Out–of–Order RISC CPU ", ISSCC: Dig. of Tech. Papers, pp. 210–211, Feb, 1996.

W.C. Athas et al., "Low–power Digital Systems based on Adiabatic–Switching Principles", IEEE Trans. Very Large Scale Integration (VLSI) Systems, vol. 2(4), pp. 398–406, 1994.

J.S. Denker, "A Review of Adiabatic Computing", 1994 IEEE Symp. of Low Power Electronics Dig. of Tech Papers, Oct. 1994.

C.L. Seitz et al., "Hot–Clock nMOS", 1985 Chapel Hill Conference on VLSI, pp. 1–17, 1985.

A. Kramer et al., "Adiabatic Computing with 2N–2N2D Logic Family", 1994 Symp. on VLSI Circuits: Dig. Tech. Papers, 1994.

S.G. Younis and T.F. Knight, Jr., "Practical Implementation of Charge Recovering Asymptomatically Zero Power CMOS", Proc. of the 1993 Symp. on Integrated Systems, pp. 234–250, 1993.

(List continued on next page.)

*Primary Examiner*—Jon Santamauro
*Attorney, Agent, or Firm*—Blakely, Sokoloff, Taylor & Zafman LLP

[57] ABSTRACT

A gate for use in a logic cascade is described. The gate comprises two evaluate and precharge network pairings. One of the evaluate networks generates an output signal, while the other evaluate network generates an output complement signal. Each of the evaluate networks further has a precharge network associated therewith. Each of the evaluate and precharge networks is coupled to a common power rail, which carries a power clock signal, so as to provide an approximately constant capacitive load to a power clock signal generation circuit. Each of the evaluate networks further includes a principle MOSFET switch and a complementary MOSFET switch, the complimentary MOSFET switch having a threshold voltage different from that of the principle MOSFET switch.

16 Claims, 5 Drawing Sheets

OTHER PUBLICATIONS

Y. Moon and D.K. Jeong, "Efficient charge Recovery Logic", 1995 Symp. on VLSI circuits: Dig. Tech. Papers, pp. 129–130, 1995.

S.G. Younis and T.F. Knight, Jr., "Non–Dissipative Rail Drivers for Adiabatic Circuits", Proc. 1995 Chapel Hill Conference on VLSI, pp. 404–414, 1995.

R.T. Hinman and M.F. Schlecht, "Recovered Energy Logic—A Highly Efficient Alternative to Today's Logic Circuits", IEEE Power Electronics Specialists' Conference Record, pp. 17–26, 1993.

R.T. Hinman and M.F. Schlecht, "Power Dissipation Measurements in Recovered Energy Logic", 1994 Symp. on VLSI Circuits: Dig. Tech. Papers, 1994.

A.P. Chandrakasan et al., "A Low–Power Chipset for Portable Multimedia Applications", ISCC: Dig. Tech. Papers, pp. 82–83, Feb. 1994.

D. Maksimovic, "A MOS Gate Drive with Resonant Transitions", Proc. IEEE Power Electronics Specialists Conference, pp. 527–532, 1991.

T. Indermaur and M. Horowitz, "Evaluation of Charge Recovery Circuits and Adiabatic Switching for Low Power CMOS Design", 1994 Symp. on Low–Power Electronics: Dig. of Tech Papers, pp. 102–103, Oct. 1994.

J.B. Burr, "Cryogenic Ultra Low Power CMOS", 1995 Symp. on Low–Power Electronics: Dig. of Tech. Papers, pp. 82–83, Oct. 1995.

M. Nandakumar et al., "A Device Design Study of 0.25 $\mu$m Gate Length CMOS for IV Low Power Applications", 1995 Symp. on Low–Power Electronics: Dig. of Tech. Papers, pp. 80–81, Oct. 1995.

A.P. Chandrakasan et al., "Low Power CMOS Digital Design", IEEE J. Solid–State Circuits, 27(4), pp. 473–484, Apr. 1992.

METHOD AND APPARATUS FOR IMPLEMENTING A DYNAMIC ADIABATIC LOGIC FAMILY

FIELD OF THE INVENTION

The present invention pertains to the field of low-power logic circuitry. More particularly, the present invention relates to a method and apparatus for implementing a dynamic adiabatic logic family.

BACKGROUND OF THE INVENTION

As operating frequencies and circuit densities have increased, energy dissipation and power flux have become problematic in a wide variety of digital devices, ranging from small portable systems, (e.g. laptops and Personal Digital Assistants), where battery size, weight and operational life are critical, to large computing machines where cooling and power supply pose substantial packaging problems. Power consumption and dissipation within digital electronic devices is largely attributable to switching activities occurring within components of such devices. In conventional Complementary Metal-oxide Semiconductor (CMOS) switches, dissipation is primarily attributable to the transfer of charge from a voltage source to a gate capacitance through a switching device which is resistive. By way of explanation, reference is made FIG. 1, which shows a simple CMOS inverter circuit 10. A logic input 12 is provided to the gate terminals on a P-channel MOS (pMOS) switch 14 and N-channel MOS (nMOS) switch 16, the drain terminals of the pMOS and nMOS switches being coupled to the node 18. A capacitor 20 is coupled between the node 18 and ground. As will be appreciated, when the input 12 is driven low, the pMOS 14 switches on, thus causing the capacitor 20 to be charged from the voltage source $V_{CC}$ through the pMOS switch 14, and a logical one (HIGH) is registered at node 18. Similarly, when the input 12 is driven high, the pMOS switch 14 switches off, and the nMOS switch 16 switches on, thus allowing charge stored in the capacitor 20 to be transferred via the nMOS switch 16 to ground, whereafter a logical zero (0) is registered at node 18. Each transition of the input signal 12 results in the transfer of a certain amount of charge across one of the switches 14 or 16. In conventional CMOS switches, such as those shown in FIG. 1, each transfer of charge is coupled with the dissipation of a certain amount of energy, which is approximately $\frac{1}{2} CV_{CC}^2$. A number of methods of reducing this quantity of energy dissipation have been proposed, including reducing the operating voltage $V_{CC}$, reducing the capacitance C, and reducing the number of switching operations which occur within an integrated circuit.

Recently, the concept of adiabatic circuits has been proposed as a method of reducing energy dissipation. Simply stated, adiabatic computing seeks to avoid the occurrence of a sudden and large potential difference across a switch when that switch is closed, and in this way to limit power dissipation. As the power dissipated across a resistive device, such as a switch, is equal to $I^2R$, by controlling the rate at which charge traverses the switch (i.e. the current), it is possible to limit the energy dissipated. Accordingly, adiabatic circuits strive to:

(1) only close a switch when the potential difference across the switch is zero (or at least at a minimum); and
(2) slowly increase, or ramp, a voltage source from which charge is transferred across the switch. It will be appreciated that the slower the rate of increase of the voltage, the slower the rate at which the charge will traverse the switch, and the less the energy dissipated.

The challenge facing the designers of adiabatic circuit is the implementation of large logic blocks using gates which maximize the number of times switches are closed with zero, or minimal, potential differences across the switches. A number of circuits and methodologies of implementing adiabatic circuits have been disclosed in the prior art. However, these circuits have included large numbers of switching devices, as well as large numbers of power clock inputs.

SUMMARY OF THE INVENTION

According to one aspect of the invention, there is provided a gate for use in a logic cascade or pipeline. The gate includes a first evaluate network, which generates an output signal, and has a first precharge network associated therewith. The gate further includes a second evaluate network, which generates an output complement signal, and has a second precharge network associated therewith. Both the first and second evaluate networks are coupled to a common power rail which carries a power clock signal, and provide an approximately constant capacitive load to a power clock signal generation circuit.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An apparatus and method for implementing a dynamic adiabatic logic family are described. In the following description, for purposes of explanation, numerous specific details are set forth in order to provide a thorough understanding of the present invention. It will be evident, however, to one skilled in the art that the present invention may be practiced without these specific details.

Figure 1:
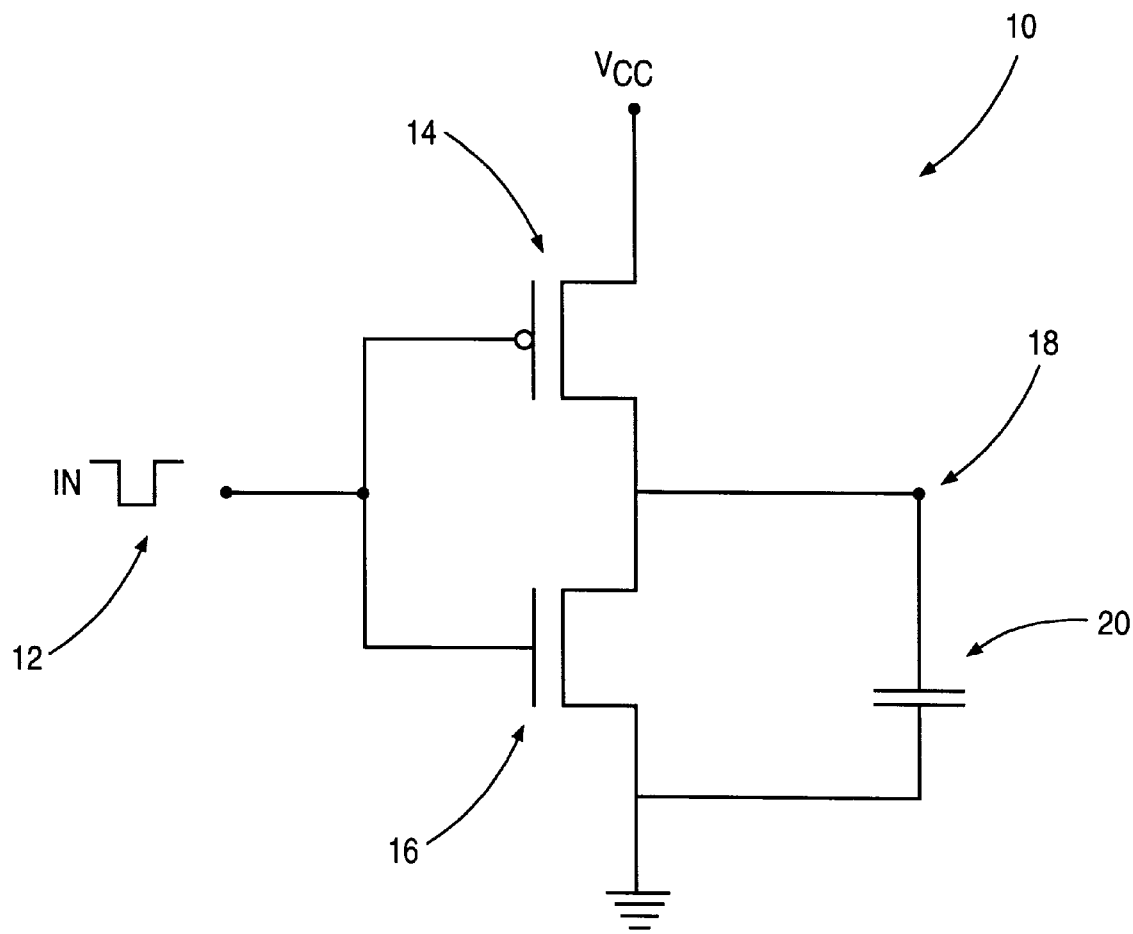
FIG. 1 is a circuit diagram showing a conventional CMOS inverter circuit.
Figures 2, 3:
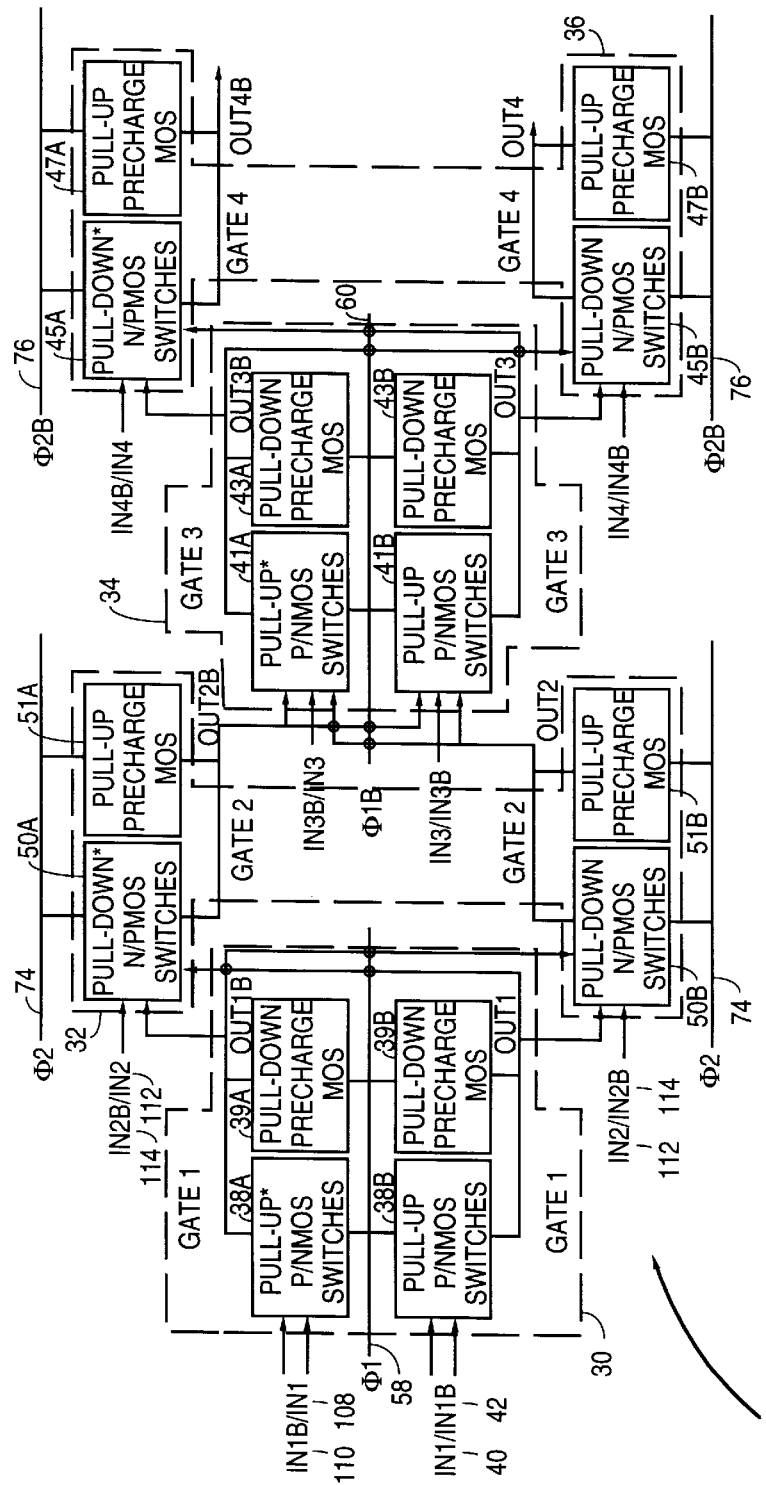
FIG. 2 is circuit diagram illustrating a cascade of logic stages comprising one embodiment of an adiabatic circuit according to the invention.
FIG. 3 shows waveforms of exemplary power clocks for use in the cascade shown in FIG. 2.

Referring firstly to FIG. 2, there is shown a cascade (or pipeline) of adiabatic logic stages, designated generally by reference numeral 28, comprising gates 30, 32, 34, and 36. Each of the gates 30 and 34 comprises two arrangements of pull-up switches (termed "pull-up evaluate networks"), and each pull-up switch network has an arrangement of pull-down precharge MOS circuitry (termed a "pull-down precharge network") associated therewith. Similarly, each of the gates 32 and 36 includes two pull-down evaluate networks, and each pull-down evaluate network has a pull-up precharge network associated therewith. Each gate 30, 32, 34 and 36 is further coupled to receive at least a single input and its complement (depending on the logic functions performed by the arrangements of pull-up switches) and to output at least a single output signal and its complement, which may in turn comprise an input to a downstream gate. Each gate 30, 32, 34 and 36 is also coupled to a single, common power rail, which carries a power clock waveform. Specifically, the gate 30 is coupled to a power rail 58 (which carries a first power clock waveform Ø1), gate 32 is coupled to a power rail 74 (which carries a second power clock waveform Ø2), gate 34 is coupled to a power rail 60 (which carries a third power clock waveform Ø1b), and gate 36 is coupled to a power rail 76 (which carries a fourth power clock waveform Ø2b). The first and second power clock waveforms Ø1 and Ø2 are approximately 90 degrees out-of-phase. The third power clock waveform Ø1b b is approximately 180 degrees out-of-phase with the waveform 01, and the fourth power clock waveform Ø2b is approximately 180 degrees out-of phase with the waveform Ø2.

A description of the structure of each of the gates 30–36 will now be provided. The gate 30 (GATE1) comprises two pull-up evaluate networks 38a and 38b, each of which comprises an arrangement of P-type and N-type switching devices. In one embodiment, each P-type switching device is a p-channel Metal Oxide Semiconductor (pMOS) switch and each N-type switching device is a n-channel Metal Oxide Semiconductor (nMOS) switch. The pull-up evaluate networks 38a and 38b are each coupled to receive an input (IN1) 108 and an input complement (IN1b) 110, and are each configured to perform a logic function (e.g. inversion, NAND or NOR functions) and to output a respective logic signal, or a output (OUT1 and OUT1b), in response to the input (IN1) 108 and the input complement (IN1b) 110. Each of the pull-up networks 38a and 38b may be configured, according to well-known CMOS techniques, to perform a desired logic function. The pull-up evaluate networks 38a and 38b are characterized in that they are complementary. For example, if the pull-up network 38b performs a NAND operation on the input 108, which may comprise two signals A and B, to generate the output (OUT1), then the pull-up network 38a performs a NOR on the input complement 110, which may comprise signals Aa and Bb, to generate output complement (OUT1b). This arrangement of evaluate and precharge networks 38a, 38b, 39a and 39b, illustrated in FIG. 2, ensures that for any input condition either the output (OUT1) or output complement (OUT1b) are pulled up during evaluation. This feature ensures that a constant capacitive load is presented to a relevant power clock, regardless of the input condition. The constant power clock loading minimizes the resonant frequency variation of a power clock generator, which may be based on a LC tank circuit. For example, were either of the network pairings 38a and 38b, or 39a and 39b, to be omitted from the gate 30, the output of the gate 30 would become decoupled from the power clock Ø1, and a LC tank circuit within a power clock generator (generating the power clock Ø1) would see a variable capacitance, thus causing variance in frequency.

Figure 4:
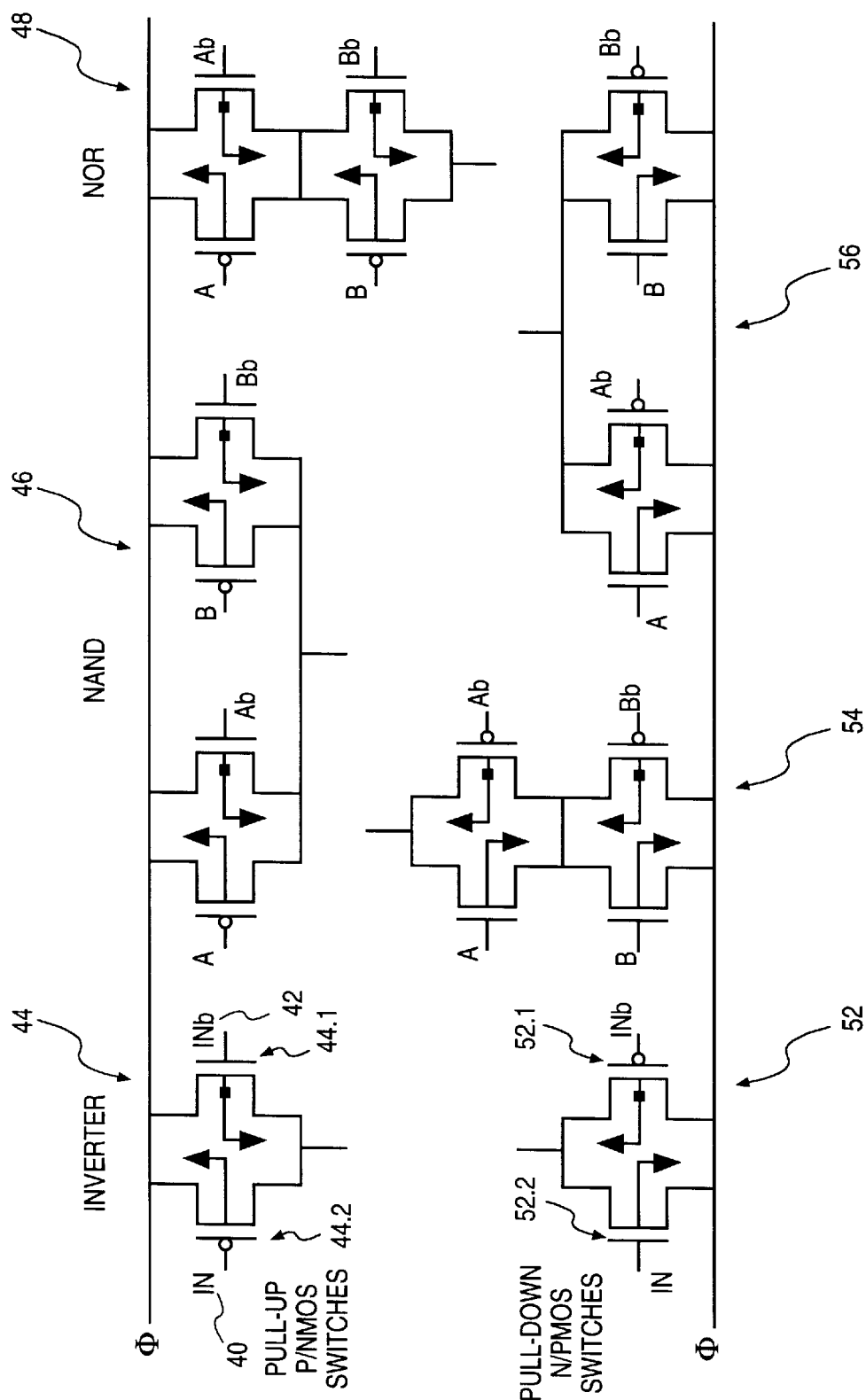
FIG. 4 illustrates a number of exemplary pull-up and pull down evaluate networks which may be utilized within the cascade shown in FIG. 2.

Referring now to FIG. 4, examples of pMOS and nMOS switch arrangements, which may be used to construct the pull-up evaluate networks 38a and 38b, are illustrated at 44, 46 and 48. Specifically, pMOS and nMOS switches could be configured to implement the inverter arrangement 44, the NAND arrangement 46 or the NOR arrangement 48. The inverter arrangement 44 is shown to comprise a complementary nMOS switch 44.1 and a principal pMOS switch 44.2. In each of the switch arrangements 44, 46 and 48, the pMOS switches are coupled to receive the input 108, and the nMOS switches are coupled to receive the input complement 42. In the case of the NAND arrangement 46 and the NOR arrangement 48, the input 108 comprises two inputs, mainly inputs A and B, and the input complement 110 comprises the complements of the inputs A and B. It will readily be appreciated that, by utilizing various combinations of the switch arrangements 44–48, it is possible to implement any logic function within a pull-up network 38 to provide a predetermined logic output in response to the input 108 and the input complement vector 110.

It is significant that two MOSFETS of different threshold voltages and opposite conductivity types (viz. nMOS in parallel with pMOS and vice versa) are used in parallel for every switch to guarantee that the output node of pull-up network is connected to the power clock when they are at the same potential. Specifically, each switch comprises a principal MOSFET (indicated without a "square" near the body connection) and a complementary MOSFET (indicated with a "square" near the body connection). The threshold voltage of a principal MOSFET is indicated as Vtsp, of a principal pMOSFET as Vtsp, of a complementary MOSFET as Vtsnn, and of a complementary pMOSFET as Vtspp. The significance of the differing threshold voltages of two MOSFETS used in parallel will be further explained below. In one embodiment, the MOSFETs in the p/n - and n/p-MOS switches marked with a square in FIG. 4 have a very high zero-bias threshold voltage (i.e. Vtsnn or Vtspp) obtained through additional threshold-adjusting implants or statistically applied reverse bias to a respective tub. The threshold voltage choices for these devices are expanded upon below.

Figure 5:
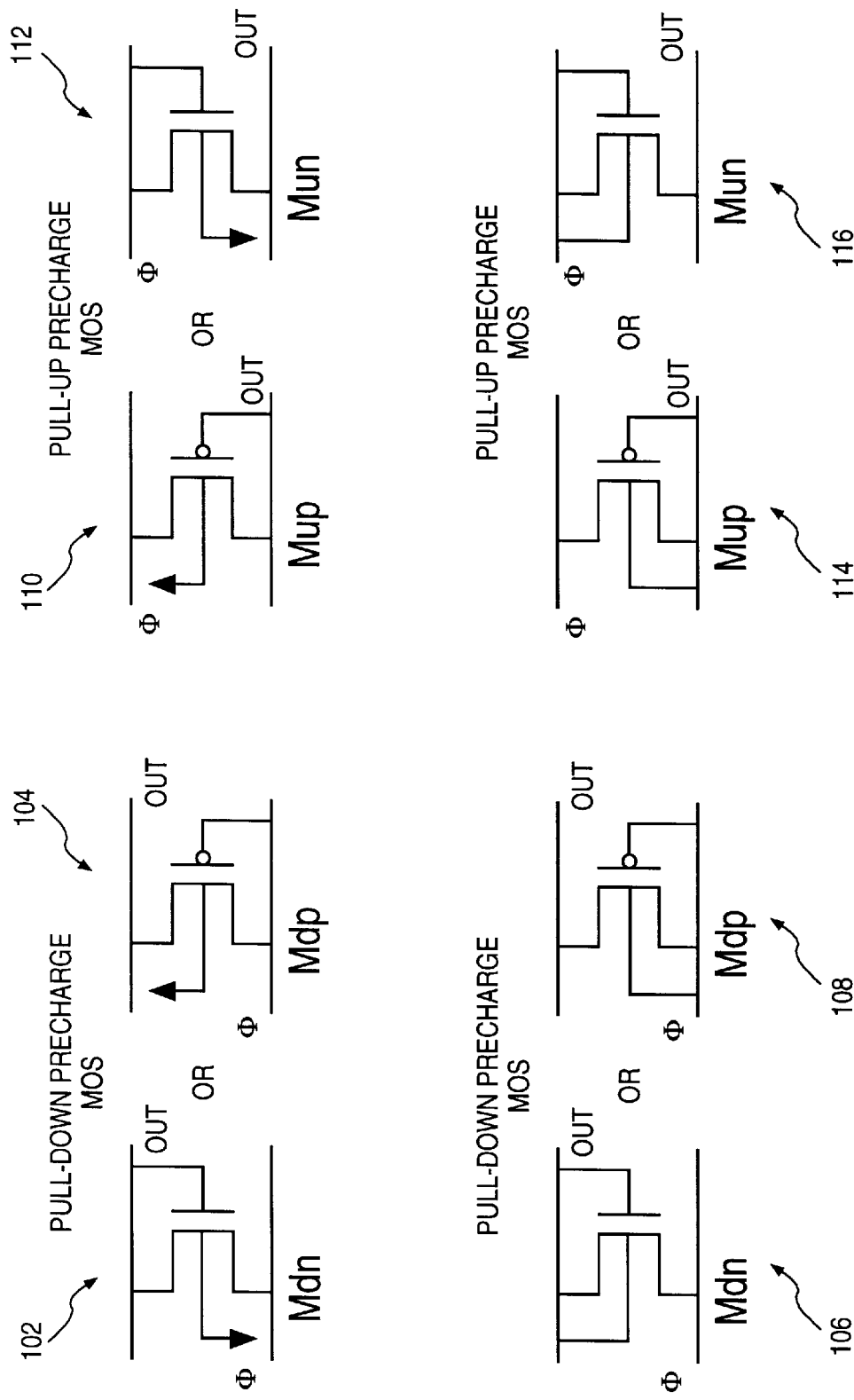
FIG. 5 illustrates a number of exemplary pull-up and pull down precharge networks which may be utilized within the cascade shown in FIG. 2.

The gate 30 further includes two pull-down precharge MOS networks 39a and 39b, each of which is associated with a respective pull-up evaluate network 38a or 38b. Examples the pull-down precharge networks 39a and 39b are illustrated in FIG. 5. The pull-down precharge networks 39a and 39b are used to reduce the output node voltage to a small value, close to ground, regardless of the condition of the input. Thus the gate 30 is ready for pull-up evaluation of the input conditions during a subsequent phase of the power clock waveform Ø1.

In the illustrated embodiment, each of the precharge networks comprises either a pMOS transistor (MOSFET 104 or 108) or a nMOS transistor (MOSFET 102 or 106). The MOSFETS 106 and 108 are furthermore shown to be body connected (i.e. the bodies are coupled to the drains of the transistors) to facilitate a reduction in energy dissipation across these devices. Specifically, when an output is being pulled up or down through the MOSFETs 106 or 108, the energy dissipated is proportional to the potential drop across the MOSFET. By connecting the body to the drain, the reverse source-to-body bias of the MOSFET is limited to approximately its threshold voltage. Larger amounts of reverse source-to-body bias, expected when the body is connected to $V_{CC}$ (for pMOS) and ground (for nMOS), increase the MOS threshold voltage, and thus the energy dissipation within the MOSFET.

The construction of the MOSFETS 106 and 108 may require a Triple-Tub CMOS (TRIMOS) process, which is a modification of the twin-tub bulk CMOS process.

The gate 32 (GATE2) is distinguished in a first respect from the gate 30 in that it includes two arrangements of pull-down switches, or pull-down evaluate networks 50a and 50b, which are also coupled to receive the output 112 (OUT1) and the output complement 114 (OUT1b) of gate 30. Accordingly, OUT1 comprises the input 112 (IN2), and OUT1b comprises the input complement 114 (IN2b) of gate 32. The pull-down evaluate networks 50a and 50b may comprise any of the pull-down switch arrangements 52, 54 or 56 shown in FIG. 4, or any combination of these switch arrangements, so as to output a desired logic signal in response to the input 112 and the input complement 114. Each switch within the pull-down evaluate networks 50a and 50b is either a P-type switching device or a N-type switching device. In an exemplary embodiment, each P-type switching device is a pMOS switch, and each N-type switching device is a nMOS switch. The inverter arrangement 52 is shown to comprise a pMOS switch 52.1 and a nMOS switch 52.2. The pull-down evaluate networks 50a and 50b are differentiated from the pull-up evaluate networks 38a and 38b in that each nMOS switch is coupled to receive the input 112 (which may comprises inputs A and B), and each pMOS switch is coupled to receive the input complement 114 (which may comprise inputs Ab and Bb). As with the pull-up switch arrangements, the pull-down switch arrangements 52, 54, and 56 each comprise at least two MOSFETS of different threshold voltages and opposite conductivity, used in parallel to guarantee that an output node is connected to a power clock when they are at the same potential, as will be described below.

The pull-down evaluate networks 50a and 50b of gate 32 are each configured to perform a logic function (e.g. inversion, NAND or NOR functions) and to output a respective logic signal, or a output and output complement (OUT2 and OUT2b), in response to the input 112 (IN2=OUT1), the input complement 114 (IN2b=OUT1b). Each of the pull-down evaluation networks 50a and 50b may be configured, according to well known CMOS techniques, to perform a desired logic function. As with the pull-up networks 38a and 38b, the pull-down networks are characterized in that they are complementary. For example, if the pull-down network 50b performs a NAND operation to generate the output vector (OUT2), then the pull-down network 50a performs a NOR operation to generate out complement vector (OUT1b).

The gate 32 is distinguished in a second respect from the gate 30 in that it includes two pull-up precharge MOS networks 51a and 51b, 20 each of which is associated with a respective pull-down evaluate network 50a or 50b. Examples of the pull-up precharge networks 51a and 51b are illustrated in FIG. 5.

The pull-up precharge networks 51a and 51b function in a manner analogous to the pull-down precharge networks 39a and 39b, as described above.

Gate 34 (GATE3) is substantially identical to gate 30 (GATE1) in construction, but is differentiated in that gate 34 receives the power clock waveform Ø1b, whereas gate 30 receives power clock waveform Ø1.

Gate 36 (GATE4) is substantially similar to gate 32 (GATE2) in construction, but is differentiated in that gate 36 receives power clock waveform Ø2b, whereas gate 32 receives power clock waveform Ø2.

It will accordingly be appreciated that immediately adjacent gates (such as gates 30 and 32) alternately have pull-up "evaluate" networks and pull-down "evaluate" networks, as well as associated pull-down "precharge" networks and pull-up "precharge" networks. The pair of gates 30 and 32 thus constitutes a "pattern" that is repeated throughout a cascade of logic gates constructed according to the teachings of the present invention. This "pattern" of networks and power/clock ensures that when gates (i) evaluates, gate (i–b 1) is in an active evaluate mode, gate (i+1) is in an active precharge mode, and gates (i±2) are precharging. This will be explained in further detail below, and guarantees functionality and correct propagation of data across a cascade of gates.

The pull-up evaluate networks 38a and 38b, and the pull-down precharge networks 39a and 39b, of gate 30 are each coupled to the power rail 58 which carries the first power clock waveform Ø1, while the pull-up evaluate networks 41a and 41b, and the associated pull-down precharge networks, are each coupled to the power rail 60, which carries the power clock waveform Ø1b. In one embodiment of the invention, the power clock waveforms Ø1 and Ø1b are approximately 180 degrees out-of-phase, as is described below with reference to FIG. 6. Examples of how individual switches within each of the pull-up networks 38a and 38b may be coupled to receive the power clock waveforms Ø1 are illustrated in FIG. 4. Referring to FIG. 3, an exemplary waveform Ø1 is illustrated, in which the power clock waveform Ø1 has a rise time of Tr in which it ramps from 0V to Vdd. The waveform Ø1 then is held at Vdd for a predetermined time, before again linearly ramping down from the Vdd to 0V. While the power clock waveform Ø1 is shown to ramp up and down in a linear fashion in FIG. 3, the waveform Ø1 could also assume any other waveform shape, and the trapezoidal waveform shown in FIG. 3 should be regarded only as an illustrative example. In one embodiment, a high-efficiency capacitive power supply technique for the generation of a staircase power clock waveform from multiple DC sources may be used to approximate a linear ramp power clock waveform. In another embodiment, a more efficient inductive power supply technique that generates a sinusoidal dual-phase power clock waveform from a single Direct Current (DC) source and whose frequency is insensitive to the logic state of a chip may be more suitable for maximizing energy efficiency.

The pull-down networks 50a and 50b, and pull-down networks 51a and 51b, of gate 32 are each coupled to the power rail 74 which carries the power clock waveform Ø2, while the pull-up networks 45a and 45b, and their associated pull-down networks 47a and 47b, of gate 36 are each coupled to the power rail 76, which carries the power clock waveform Ø2b. In one embodiment of the invention, the power clock waveforms Ø2 and Ø2b are approximately 180 degrees out-of-phase (i.e. the inverse of each other).

The clock form Ø2 may be similar in form to the power clock waveform Ø1 and, as shown in FIG. 3, out-of-phase with respect to the power clock waveform Ø1 by a predetermined amount. In one embodiment, the power clock waveforms Ø1 and Ø2 are out-of-phase by three-quarters of a clock cycle, as shown in FIG. 3. The difference in phase between the waveforms Ø1 and Ø2 further results in the outputs of the secondary gates 32 and 36 being out-of-phase with, or lagging, the outputs of the associated primary gates 30 and 34, as is described in more detail below with reference to FIG. 6.

Figure 6:
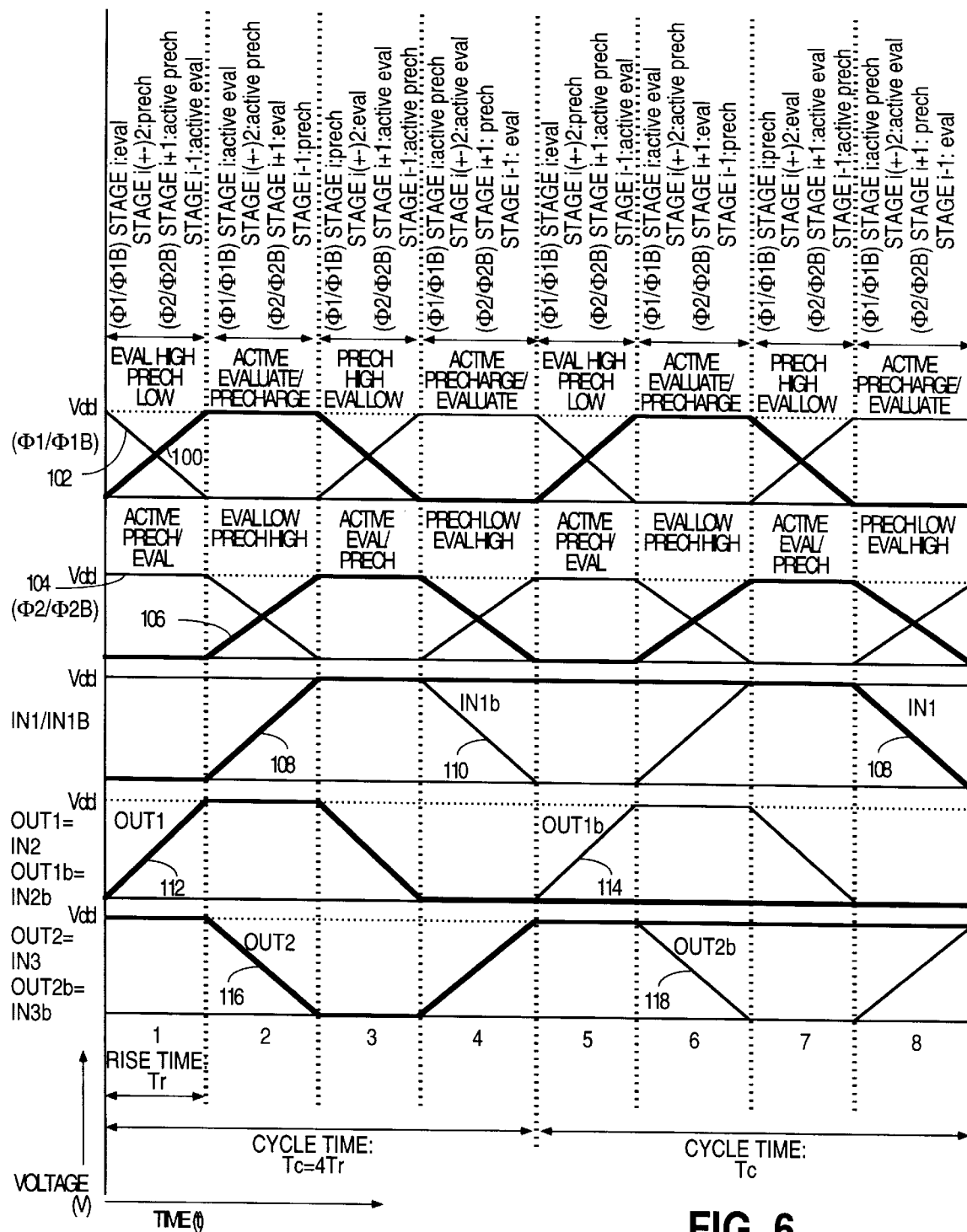
FIG. 6 is a timing diagram showing the timing and transitions of selected signals within the cascade shown in FIG. 2, in which the pull-up and pull-down networks comprise inverters.

Functioning of the above described cascade 28 of logic stages, and further details of the pull-up and pull-down evaluate networks, will now be described with reference to FIGS. 4–6. FIG. 6 is a timing diagram illustrating the transitioning of signals within the cascade 28 in response to transitions of the input 108, the input complement 110 and the power clock waveforms Ø1, Ø1b, Ø2 and Ø2b. FIG. 6 provides illustrative examples of the power clock waveforms Ø1 100, Ø1b 102, Ø2 104 and Ø2b 106, and well as the signal waveforms IN1 108 and IN1*b* 110, IN2 (or OUT1) 112, IN2*b* (or OUT1*b*) 114, IN3 (or OUT2) 116 and IN3*b* (or OUT2*b*) 118. The timing diagram further illustrates operation of an embodiment of the invention in which the cascade 28 comprises a chain of inverters, and in which the pull-up and pull down evaluate networks 38*a*, 38*b*, 50*a*, 50*b*, 41*a*, 41*b*, 45*a* and 45*b* accordingly comprise inverters, such as the inverters 44 and 52 illustrated in FIG. 4. Further, in the embodiment described with reference to FIG. 6, the pull-up and pull-down precharge networks are assumed to include body-connected MOSFETS, such as those illustrated in FIG. 5 at 106, 108, 114 and 116. An understanding of the functioning of embodiments of the invention in which these networks comprises the NAND or NOR gates (or any combination thereof to realize a logic function) will readily be appreciated by those skilled in the art in light of the below description.

Referring now specifically to FIGS. 2 and 6, the operation of the cascade 28 as it transitions through four stages, during two full clock cycles, is illustrated. Each of these two full clock cycles is furthermore divided into four regions (regions 1–4 and 5–8 respectively), each region having a duration of Tr, where Tr is the rise time of the power clock waveforms Ø1 and Ø2. During the first half cycle (regions 1 and 2), the input is evaluated by gate 30, and during the second half cycle (regions 3 and 4), the output of gate 30 is precharged while the input is driven by the previous stage to a new value as triggered by any change to the input of the previous stage. The below description will describe the states of various components, voltage states, and the movement of charge within the inverter cascade 28.

For the purposes of this description, each gate 30–36 of the inverter cascade 28 will be referred to as a "stage". The input to the ith stage of the inverter cascade 28 is "evaluated" during the first quarter cycle (region 1), while the outputs of the preceding stage (i−1) are in an "active evaluate" mode, and the outputs of proceeding stage (i+1) are in an "active precharge" mode.

When in the above modes, the stages perform as follows:
(1) "evaluate" mode: the stage begins and ends charging/discharging of an output based on input conditions;
(2) "active evaluate" mode: the stage holds the output at the evaluated value/state;
(3) "precharge" mode: the stage charges/discharges an output to a predetermined value, regardless of any input conditions; and
(4) "active precharge" mode: the stage holds the output and the precharge value.

During the immediately following quarter cycle (region 2), the output of the ith stage is in the "active evaluate" mode, while stages (i−1) and (i+1) are in "precharge" and "evaluate" modes, respectively. During the third quarter cycle (region 3), the ith stage precharges, while stages (i−1) and (i+1) are in the "active precharge" and the "active evaluate" modes, respectively. In the fourth and final quarter cycle (region 4), the ith stage is in the "active precharge" mode, while stages (i−1) and (i+1) are in the "evaluate" and the "precharge" modes, respectively. This same sequence of evaluations and precharges is repeated in the quarter cycles (regions 5–6) of the next clock cycle, and so on. Accordingly, the present invention proposes a micro-pipelined logic family in that, while the ith stage is evaluating its inputs, the inputs are "actively evaluated" by the preceding stage and the following stage is "actively precharged", while the stages (i±2) are precharged. Thus, the present invention is suitable for high-throughput applications.

Referring now specifically to FIG. 6, the initial state of the ith stage inverter is, merely for example, defined as:
1. input 108 (IN1)=LOW (0V);
2. input complement 110 (IN1*b*)=HIGH (Vdd);
3. output 112 (OUT1)=LOW; and
4. output 114 (OUT1*b*)=LOW.

Further assume that the principal switching pMOSFETS 44.2 of both pull-up networks 38*a* and 38*b* are off, that the complementary nMOSFET 44.1 of the pull-up evaluate network 38*b* is on, and that the complementary nMOSFET 44.1 of the pull-up evaluate network 38*a* is off.

Region 1: As the pull-up clock 100 (Ø1) ramps linearly from 0 to Vdd, the output 112 (OUT1) starts being adiabatically charged through the pull-up complementary nMOSFET 44.1, which is on, of pull-up network 38*b*. The principal pMOSFET 44.2 of network 38*b* then turns on when the waveform 100 (01)=Vtsp, where Vtsp is the threshold voltage of the principal pMOSFET 44.2. The output 112 (OUT1) is thus driven by the pull-up clock waveform 100 (Ø1) through the nMOS-pMOS pair of the pull-up network 38*b*. As output 112 (OUT1) reaches Vdd−Vtsnn, where Vtsnn is the threshold voltage of the complementary nMOSFET 44.1 of the pull-up network 38*b*, this nMOSFET 44.1 turns off, and the output 112 is charged through the principal pull-up pMOSFET 44.2 of network 38*b*. As the input complement 110 (IN1*b*) remains HIGH, and the input 108 (IN1) remains LOW, the pull-up pMOS-nMOS pairing of the inverter comprising the pull-up network 38*a* remains off, maintaining the output complement 114 (OUT1*b*) at LOW, the precharge value.

Region 2: The pull-up clock waveform 100 (Ø1) remains at Vdd, thus actively driving the output 112 (OUT1) until the input 108 (IN1), which is now being precharged high, exceeds Vdd−Vtsp. At the same time, the output 116 (OUT2) of the pull-down network 50*b* (i.e. the inverter 50*b*) is pulled down adiabatically to LOW through the pull-down network 50*b*. As the input waveform 108 (IN1) exceeds Vdd−Vtsnn, the pull-up complementary nMOS 44.1 of pull-up network 38*a* turns on. As a result the output complement 114 (OUT1*b*) begins to be charged up to Vdd−Vtsnn by the pull-up clock waveform 100 (Ø1). However, as described above, since Vtsnn is selected to be high relative to Vtsp, this charging time constant is large compared to the cycle time. Furthermore, the selection of a sufficiently large value of Vtsnn guarantees that the evaluation of the inverter 50*b* is unaffected by this undesirable deviation of the output complement (OUT1*b*) 114. Consequently, at the end of region 2, the first half cycle of the clock, the LOW input (IN1) to gate 30 has been evaluated, and the signal propagated through to gate 32. Referring to FIG. 4, the threshold voltages Vtsnn/pp of the complementary switching MOSFET's (marked with "squares" and appearing in parallel to the principal switching MOSFET's in FIG. 4) must be chosen in order to i) guarantee error free operation and ii) minimize the energy dissipation per cycle.

In order to ensure error-free operation, Vtsnn/pp (with body bias)≧Vdd−Vtsn/p so that during the "active evaluate" portion of the power-clock cycle (when the input to the complementary MOSFET in question is being precharged by the previous stage), deviations in its output are guaranteed not to cause erroneous switching of the MOSFET of the next stage which is in the process of evaluating its own inputs. Vtsn/p are the zero-bias threshold voltages of the principal nMOS and pMOS switches and Vdd is the supply voltage.

Furthermore, to eliminate any non-adiabatic energy dissipation during the "evaluate" process, Vtsnn/pp (with body bias)<Vdd−Vtsp/n (with body bias). However, selecting Vtsnn/pp values larger than Vdd−Vtsp/n reduces the non-adiabatic energy dissipation during the "active evaluate" phase, while causing larger dissipation during the "evaluate" process. Consequently, for very high operation frequencies (high-performance applications) where the dissipation during the "evaluate" phase is the dominant component, Vtsnn/pp (with body bias)<Vdd−Vtsp/n (with body bias) minimizes the total energy dissipation. On the other hand, for fixed-throughput applications (over low operating frequencies) where the non-adiabatic component of the dissipation during the "active evaluate" phase dominates the overall energy consumption, Vtsnn/pp (with body bias) ≧Vdd−Vtsp/n (with body bias) minimizes the total dissipation. An expression for the zero-bias threshold voltage value Vtsnn of the complementary nMOSFET that marks the transition point between the two distinct ranges discussed above can be derived as, $$V_{tsnn} = V_{dd} - \frac{1}{4}\left[\left\{K_{nn} + \sqrt{4(V_{dd} + 2\Phi_{nn} + 2\Phi_p - (\sqrt{V} - K_p)^2}\right\}^2 - K_{nn}^2 + 4(2\Phi_{nn} + K_{nn}\sqrt{2\Phi_{nn}})\right]$$

where $$V = K_p^2 + 4(V_{dd} - V_{Tsp} + 2\Phi_p + K_p\sqrt{2\Phi_p})$$

$K_{nn}$ and $K_p$ are the body-effect coefficients and $\Phi_{nn}$ and $\Phi_p$ are the intrinsic-to-from level potential differences in the bulk, for the complementary nMOS and principal pMOS switching devices, respectively. A similar expression can be derived for Vtspp.

Region 3: As pull-up clock waveform 100 (Ø1) ramps down from Vdd to 0V, the output 112 (OUT1) is adiabatically precharged to LOW (0V) through the pull-down precharge network 39b (i.e. the precharge MOSFET 106). As the pull-up clock waveform 100 (Ø1) falls below Vdd−Vtsnn, the complementary nMOS devices in both pull-up evaluate networks 38a and 38b turn on. As a result, the output 112 (OUT1) is precharged LOW through both pull-down precharge networks 39a and 39b, each of which comprises the nMOS device shown at 106 in FIG. 5. In addition, the accumulated charge of the output complement 114 (OUT1b) is extracted adiabatically and precharged to LOW. During this time, the output 116 (OUT2) is actively maintained at LOW by pull-down waveform 104 (Ø2).

Region 4: In this region, the pull-up clock waveform 100 (Ø1) remains LOW, keeping the output 112 (OUT1) and the output complement 114 (OUT1b) actively precharged to LOW. The pull-down clock waveform 104 (Ø1) ramps up from 0V to Vdd, thus precharging the output 116 (OUT2) to Vdd through the pull-up precharge network 51b (which in the exemplary embodiment comprises the MOSFET 116 shown in FIG. 5) and the complementary pMOS 52.1 of the pull-down evaluate network 50b. Simultaneously, the input complement 110 (IN1b) is evaluated to LOW by a gate preceding gate 30, and the input 108 (IN1) is maintained HIGH. Thus, at the end of region 4 and the first clock cycle, the gate 30 is ready to evaluate its new input that has changed from HIGH to LOW. This is accomplished in the next clock cycle (regions 5–8) in the same manner as described above. Two complementary switching operations are thus performed in the two clock cycles, at the end of which the gate 30 assumes a state identical to that at the beginning of the first clock cycle.

Accordingly, an adiabatic circuit arrangement within which a logic family can be constructed, and the manner of operation of such a circuit arrangement, have been described above. As will have been noted from the description, the switching of pMOS and nMOS switches within the pull-up and pull-down networks occurs when the potential difference across these switches are LOW, and at approximately 0V, thus preventing a flood of charge across the switches, and avoiding a resultant high energy dissipation due to the resistive natures of such switches. The present invention is advantageous in that this characteristic is achieved with only four power clock waveforms (Ø1, Ø1b, Ø2 and Ø2b), and with a limited number of switching devices.

Although the present invention has been described with reference to specific exemplary embodiments, it will be evident that various modifications and changes may be made to these embodiments without departing from the broader spirit and scope of the invention. Specifically, the above description has described the switching devices implemented using nMOS and pMOS MOSFETS in bulk Si or SOI. It will readily be appreciated that the teachings of the present invention could be implemented utilizing complementary, three-terminal FET like switching devices such as MOSFETS or HEMTs. Accordingly, the specification and drawings are to be regarded in an illustrative rather than a restrictive sense.

What is claimed is:

1. A gate for use in a logic cascade, the gate comprising:
   a first evaluate network to generate an output signal;
   a first precharge network coupled to an output of the first evaluate network;
   a second evaluate network to generate an output complement signal; and
   a second precharge network coupled to an output of the second evaluate network,
   wherein the first and second evaluate networks are coupled to a common power rail which carries a power clock signal so as to provide an approximately constant capacitive load to a power clock signal generation circuit and wherein each of the first and second evaluate networks includes a principal MOSFET switch and a complementary MOSFET switch, the complementary MOSFET switch having a threshold voltage different from that of the principal MOSFET switch.

2. The gate of claim 1 wherein the first and second precharge networks are coupled to the power rail.

3. The gate of claim 1 wherein the first and second evaluate networks are each pull-up networks, and the first and second precharge networks are each pull-down networks.

4. The gate of claim 1 wherein the first and second evaluate networks are each pull-down networks, and the first and second precharge networks are each pull-up networks.

5. The gate of claim 1 wherein the complementary MOSFET switch has a zero-biased threshold voltage that is higher than that of the principal MOSFET switch.

6. A logic cascade comprising:
   a first power rail carrying a first power clock signal;
   a second power rail carrying a second power clock signal;
   a first gate comprising:
      first and second pull-up evaluate networks, each coupled to the first power rail, and respectively to generate a first output signal and a first output complement signal in response to a first input signal and a first input complement signal; and first and second pull-down precharge networks, each coupled to the first power rail, and coupled to an output of the first and the second pull-up evaluate network respectively; and a second gate comprising:

third and fourth pull-down evaluate networks, each coupled to the second power rail, and respectively to generate a second output signal and a second output complement signal in response to the first output signal and the first output complement signal generated by the first gate; and third and fourth pull-up precharge networks, each coupled to the second power rail, and coupled to an output of the third and the fourth pull-down evaluate network respectively, wherein each of the evaluate network includes a principal MOSFET switch and a complementary MOSFET switch, the complementary MOSFET switch having a threshold voltage different from that of the principal MOSFET switch.

7. The logic cascade of claim 6 wherein the first and second power clock signals respectively comprise first and second waveforms which are out-of-phase by a predetermined amount.

8. The logic cascade of claim 7 wherein the first and second waveforms are out-of-phase by 90 degrees.

9. The logic cascade of claim 6 further comprising:

a third power rail carrying a third power clock signal;

a fourth power rail carrying a fourth power clock signal;

a third gate comprising:

fifth and sixth pull-up evaluate networks, each coupled to the third power rail, and respectively to generate a third output signal and a third output complement signal in response to the second output signal and the second output complement signal generated by the second gate; and the third power rail, and respectively associated with the fifth and sixth pull-up evaluate networks; and a fourth gate comprising:

seventh and eighth pull-down evaluate networks, each coupled to the fourth power rail, and respectively to generate a fourth output signal and a fourth output complement signal in response to the third output signal and the third output complement signal generated by the third gate; and seventh and eighth pull-up precharge networks, each coupled to the fourth power rail, and respectively associated with the seventh and eighth pull-down evaluate networks.

10. The logic cascade of claim 9 wherein the third and fourth power clock signals respectively comprise third and fourth waveforms which are out-of-phase by a predetermined amount.

11. The logic cascade of claim 10 wherein the third and fourth waveforms are out-of-phase by 90 degrees.

12. The logic cascade of claim 10 wherein the first power clock signal comprises a first waveform, and the first and third waveforms are out-of phase by 180 degrees.

13. The logic cascade of claim 10 wherein the second power clock signal comprises a second waveform, and the second and fourth waveforms are out-of-phase by 180 degrees.

14. A gate for use in a logic cascade, the gate comprising:

a first evaluate network to generate an output signal;

a first precharge network coupled to an output of the first evaluate network;

a second evaluate network to generate an output complement signal; and a second precharge network coupled to an output of the second evaluate network, each of the first and second evaluate networks including a principal MOSFET switch and a complementary MOSFET switch, the complementary MOSFET switch having a threshold voltage different from that of the principal MOSFET switch.

15. The gate of claim 14 wherein, for each of the first and second evaluate networks, the complementary MOSFET switch has a zero-biased threshold voltage that is higher than that of the principal MOSFET switch.

16. A method of manufacturing a gate for use in a logic cascade, the method including:

coupling a first precharge network to an output of a first evaluate network that generates an output signal;

coupling a second precharge network to an output of a second evaluate network that generates an output complement signal; and constructing each of the first and second evaluate networks to include a principal MOSFET switch and a complimentary MOSFET switch having different threshold voltages.

* * * * *

UNITED STATES PATENT AND TRADEMARK OFFICE
CERTIFICATE OF CORRECTION

PATENT NO. : 5,986,476
DATED : November 16, 1999
INVENTOR(S) : De

It is certified that error appears in the above-identified patent and that said Letters Patent is hereby corrected as shown below:

Column 6,
Line 2, delete "(i-bl)", insert -- (i-l) --.

Column 9,
Line 21, delete "$V_{tsnm}$ =", insert -- $V_{tsnn}$ = --.

Signed and Sealed this

Fifteenth Day of April, 2003

JAMES E. ROGAN
*Director of the United States Patent and Trademark Office*